(12) United States Patent
Adams et al.

(10) Patent No.: US 7,835,176 B2
(45) Date of Patent: Nov. 16, 2010

(54) IMPLEMENTING ENHANCED DUAL MODE SRAM PERFORMANCE SCREEN RING OSCILLATOR

(75) Inventors: Chad Allen Adams, Byron, MN (US); Todd Alan Christensen, Rochester, MN (US); Peter Thomas Freiburger, Rochester, MN (US); Travis Reynold Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 12/360,230

(22) Filed: Jan. 27, 2009

(65) Prior Publication Data

US 2010/0188888 A1 Jul. 29, 2010

(51) Int. Cl.
*G11C 11/00* (2006.01)
(52) U.S. Cl. .............. 365/154; 365/189.04; 365/230.03; 365/230.08; 365/189.08; 365/189.14
(58) Field of Classification Search .................. 365/154, 365/189.04, 189.14, 189.15, 189.16, 230.03, 365/230.08, 189.08
See application file for complete search history.

(56) References Cited

U.S. PATENT DOCUMENTS

| | | | |
|---|---|---|---|
| 6,370,073 B2 * | 4/2002 | Leung | ........................ 365/222 |
| 7,082,067 B2 | 7/2006 | Venkatraman et al. | |
| 7,142,064 B2 | 11/2006 | Chan et al. | |

OTHER PUBLICATIONS

U.S. Appl. No. 11/782,808, filed Jul. 25, 2007, by Chad Allen Adams, Todd Alan Christensen, Travis Reynold Hebig, and Kirk David Peterson, entitled "Method and Apparatus for Implementing Enhanced SRAM Read Performance Sort Ring Oscillator (PSRO)".

* cited by examiner

*Primary Examiner*—Thong Q Le
(74) *Attorney, Agent, or Firm*—Joan Pennington (57) ABSTRACT

A method and circuit for implementing an enhanced dual-mode static random access memory (SRAM) performance screen ring oscillator (PSRO), and a design structure on which the subject circuit resides are provided. The dual-mode SRAM PSRO includes a plurality of SRAM base blocks connected together in a chain. Each of the plurality of SRAM base blocks includes an eight-transistor (8T) SRAM cell, a local evaluation circuit and a logic function coupled to the SRAM cell. The eight-transistor (8T) static random access memory (SRAM) cell is an unmodified 8T SRAM cell. The dual-mode SRAM PSRO includes one mode of operation, where the output frequency is determined by write-through performance of the 8T SRAM cell; and another mode of operation, where the output frequency is determined by read performance of the 8T SRAM cell.

20 Claims, 9 Drawing Sheets

IMPLEMENTING ENHANCED DUAL MODE SRAM PERFORMANCE SCREEN RING OSCILLATOR

FIELD OF THE INVENTION

The present invention relates generally to the data processing field, and more particularly, relates to a method and circuit for implementing an enhanced dual-mode eight-transistor (8T) static random access memory (SRAM) performance screen ring oscillator (PSRO), and a design structure on which the subject circuit resides.

DESCRIPTION OF THE RELATED ART

In advanced CMOS technologies it is becoming common practice for the SRAM cells to have unique Vt implants independent from standard logic devices. This causes the SRAMs to loose tracking to the standard logic PSROs used as performance monitors for manufacturing line tuning.

Prior art circuits exists to determine 6T SRAM read performance and 8T SRAM write-through performance. In a prior art 6T SRAM PSRO, frequency is a function of only read performance and not write performance. In a prior art 8T SRAM PSRO, frequency is only a function of write-through performance.

All prior art arrangements of SRAM PSROs require modifications to the SRAM cell. This is a major flaw of the prior art because this introduces differences between the monitoring circuit and the functional circuits and separate versions of the SRAM cell are required to be maintained.

U.S. patent application Ser. No. 11/782,808 filed Jul. 25, 2007 by Chad Allen Adams, Todd Alan Christensen, Travis Reynold Hebig, and Kirk David Peterson, discloses a method and apparatus for implementing an enhanced SRAM read performance sort ring oscillator (PSRO). A pair of parallel reverse polarity connected inverters defines a static latch or cross-coupled memory cell. The SRAM cell includes independent left and right wordlines providing a respective gate input to a pair of access transistors used to access to the memory cell. The SRAM cell includes a voltage supply connection to one side of the static latch. For example, a complement side of the static latch is connected to the voltage supply. A plurality of the SRAM cells is assembled together to form a SRAM base block. A plurality of the SRAM base blocks is connected together to form the SRAM read PSRO.

The above-identified patent application provides an improved effective method and apparatus for implementing an enhanced six-transistor (6T) SRAM read performance sort ring oscillator (PSRO). The frequency of this prior art 6T SRAM PSRO is a function of only read performance and not write performance.

Figure 1:
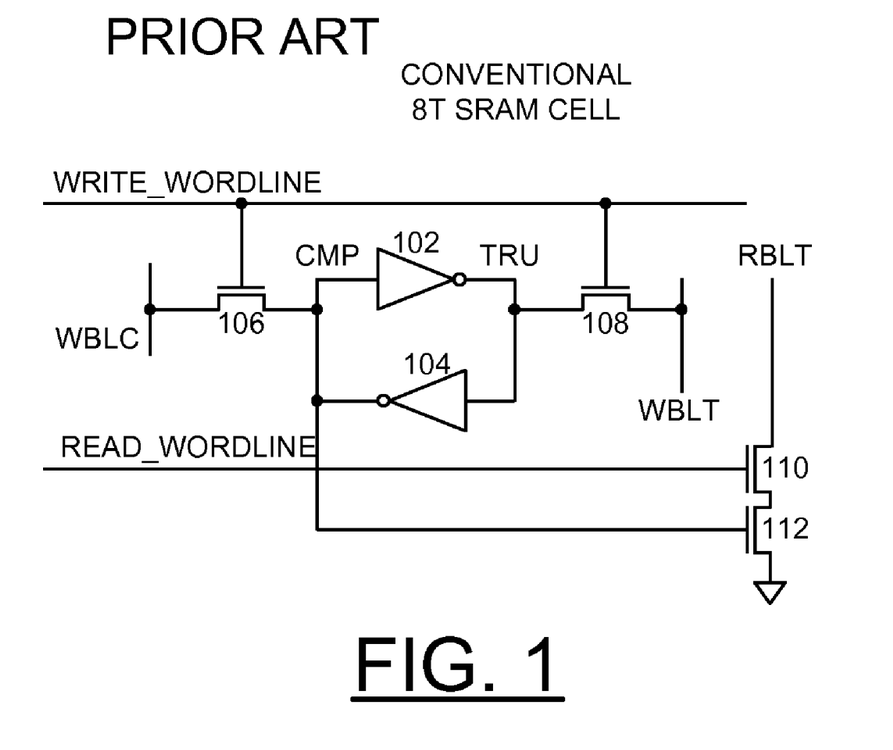
FIG. 1 illustrates a conventional eight-transistor (8T) static random access memory (SRAM) cell.

FIG. 1 illustrates a conventional eight-transistor (8T) static random access memory (SRAM) cell. The prior art 8T SRAM cell includes four transistors defining a pair of parallel reverse polarity connected inverters 102, 104 for storing data, a pair of N-channel field effect transistors (NFETs) 106, 108 respectively connected to a respective side of the static latch and a respective one of a write bit line pair WBLC, WBLT, and receiving a gate input WRITE WORDLINE that is activated to turn on NFETs 106, 108 to perform a write operation, and a pair of series connected NFETs 110, 112 connected to a read bitline RBLT with NFET 110 receiving a gate input READ_WORDLINE, and NFET 112 receiving a gate input connected to a first side or complement side (CMP) of the static latch, as shown in FIG. 1. NFET 110 is activated by the gate input READ_WORDLINE to perform a read operation.

An invention is needed to separately monitor read and write-through performance of an 8T SRAM cell using an unmodified SRAM cell.

SUMMARY OF THE INVENTION

Principal aspects of the present invention are to provide a method and circuit for implementing an enhanced dual-mode eight-transistor (8T) static random access memory (SRAM) performance screen ring oscillator (PSRO), and a design structure on which the subject circuit resides. Other important aspects of the present invention are to provide such method, circuit and design structure substantially without negative effect and that overcome many of the disadvantages of prior art arrangements.

In brief, a method and circuit for implementing an enhanced dual-mode static random access memory (SRAM) performance screen ring oscillator (PSRO), and a design structure on which the subject circuit resides are provided. The dual-mode SRAM PSRO includes a plurality of SRAM base blocks connected together in a chain. Each of the plurality of SRAM base blocks includes an eight-transistor (8T) SRAM cell, a local evaluation circuit and a logic function coupled to the SRAM cell and the local evaluation circuit. The eight-transistor (8T) static random access memory (SRAM) cell is an unmodified 8T SRAM cell. The dual-mode SRAM PSRO includes a write-through mode of operation, where the output frequency is determined by write-through performance of the 8T SRAM cell; and a read mode of operation, where the output frequency is determined by read performance of the 8T SRAM cell.

In accordance with features of the invention, the dual-mode SRAM PSRO separately monitors read performance and write-through performance of the 8T SRAM cell. The dual-mode SRAM PSRO directly tracks the performance of 8T SRAM macros much closer than standard logic PSROs. In accordance with features of the invention, the dual-mode SRAM PSRO independently measures read performance and write-through performance, mirroring functional mode SRAM operation.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, an unmodified eight-transistor (8T) static random access memory (SRAM) cell is used to create an 8T SRAM performance screen ring oscillator (PSRO) that effectively and efficiently separately monitors both read and write performance of 8T SRAM macros. The 8T SRAM PSRO of the invention provides accurate representations of functional SRAM performance and has a robust circuit implementation.

In accordance with features of the invention, the 8T SRAM PSRO includes one mode where the output frequency is determined by write-through performance of the cell, and in the other mode the output frequency is determined by read performance of the cell.

The 8T SRAM PSRO of the invention provides a significant improvement over the prior art, which suffers from design problems and poor performance matching. Also none of the prior art arrangements can measure both read performance and write performance in the same circuit.

Figure 2:
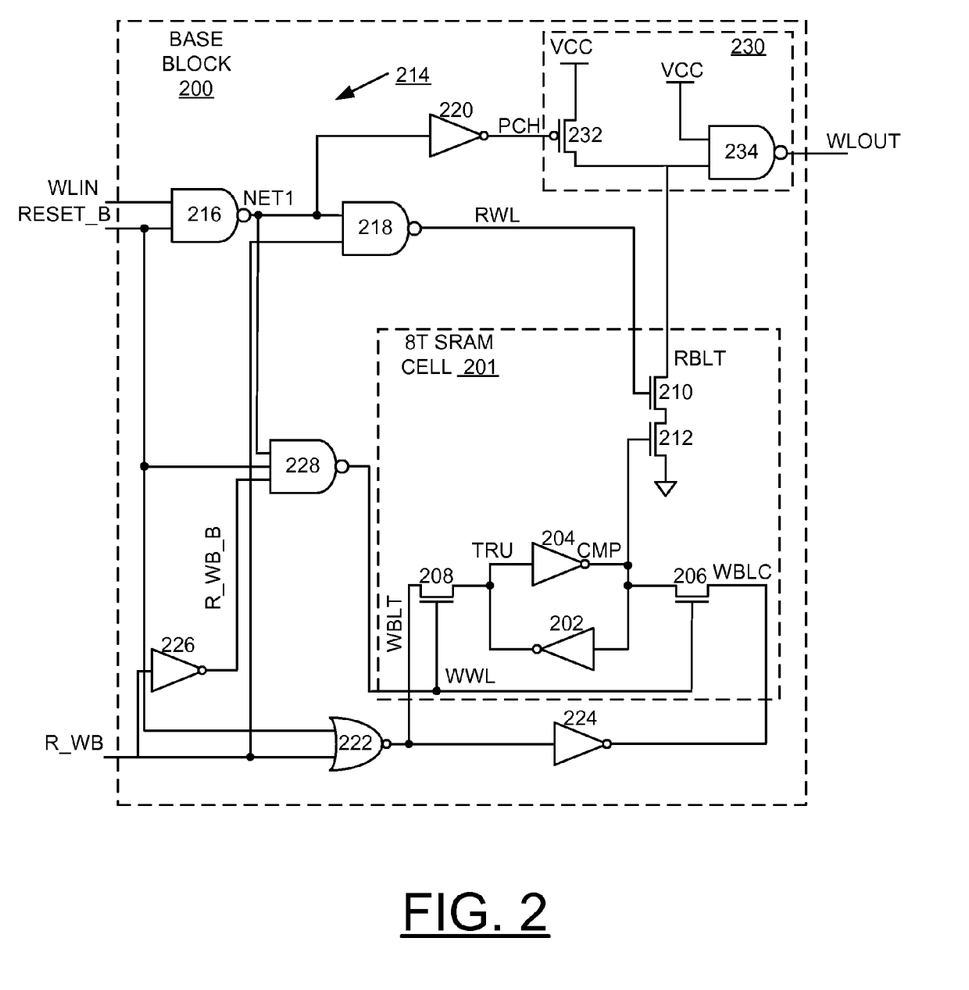
FIG. 2 illustrates an exemplary SRAM base block using an unmodified SRAM cell for implementing a dual-mode static random access memory (SRAM) performance screen ring oscillator (PSRO) in accordance with the preferred embodiment.
Figure 3:
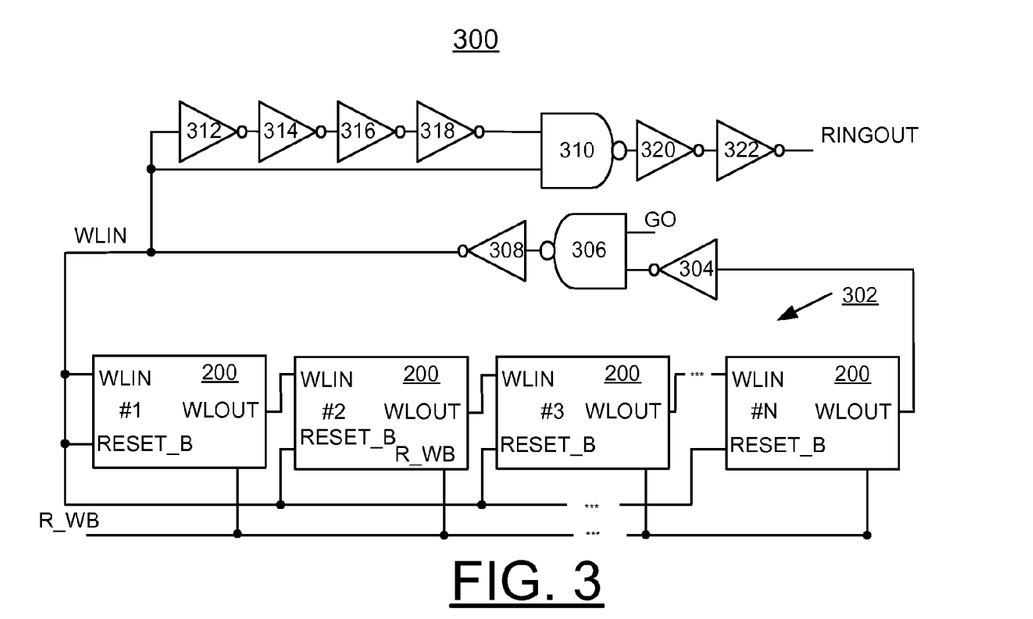
FIG. 3 illustrates an exemplary SRAM performance screen ring oscillator (PSRO) including a plurality of SRAM base blocks of FIG. 2 in accordance with the preferred embodiment.

Having reference now to the drawings, in FIG. 2, there is shown exemplary SRAM base block using an unmodified SRAM cell generally designated by the reference character 200 in accordance with the preferred embodiment. SRAM base block 200 is used for implementing a dual-mode static random access memory (SRAM) performance screen ring oscillator (PSRO), as illustrated in FIG. 3.

SRAM base block 200 includes an unmodified eight-transistor (8T) static random access memory (SRAM) cell 201. The 8T SRAM cell 201 includes four transistors defining a pair of parallel reverse polarity connected inverters 202, 204 for storing data, a pair of N-channel field effect transistors (NFETs) 206, 208 respectively connected to a respective side of the static latch and a respective one of a write bit line pair WBLC, WBLT, and receiving a write wordline gate input WWL that is activated to turn on NFETs 206, 208 to perform a write operation, and a pair of series connected NFETs 210, 212 connected to a read bitline RBLT with NFET 210 receiving a read wordline gate input RWL, and NFET 212 receiving a gate input connected to a first side or complement side (CMP) of the static latch NFET 210 is activated by the read wordline gate input RWL to perform a read operation.

SRAM base block 200 includes a logic function generally designated by the reference character 214 for applying the read wordline gate input RWL, the write wordline gate input WWL, and the write bit line pair WBLC, WBLT to the SRAM cell 201. The logic function 214 includes a NAND gate 216 receiving a wordline input WLIN and a reset signal RESET_B. An output of NAND gate 216 at NET1 is applied to a first input of a NAND gate 218 and to an inverter 220.

The logic function 214 includes a NOR gate 222 receiving the wordline input WLIN and a read input R_WB. The NORed output provides the write bit line WBLT to NFET 206. The NORed output is applied to an inverter 224, which provides the write bit line WBLC to NFET 208. The read input R_WB is applied to an inverter 226, which provides an inverted read input R_WB_B applied to a 3-input NAND gate 228. The reset signal RESET_B and the output of NAND gate 216 at NET1 are applied to other inputs the 3-input NAND gate 228. An output of the 3-input NAND gate 228 provides a write wordline input WWL applied to a gate input of both NFETs 206, 208.

SRAM base block 200 includes a local evaluation circuit 230. A portion of the local evaluation circuit 230 shown in FIG. 2 for the illustrated 1 bit slice of the dual-mode 8T SRAM PSRO circuit 300, as illustrated in FIG. 3. The local evaluation circuit 230 includes a P-channel field effect transistor (PFET) 232 connected between a voltage supply rail VCC and a connection of the read bitline RBLT output of SRAM cell 201 and a first input of a NAND gate 234. The output PCH of inverter 220 applies a gate input to the PFET 234. A second input of the NAND gate 234 is connected the voltage supply rail VCC. The NAND gate 234 provides the output WLOUT of the SRAM BASE BLOCK 200.

While the SRAM base block 200 is shown with a single modified SRAM cell 221, it should be understood that multiple dummy SRAM cells can be connected to the same write bit line pair WBLT, WBLC and read bitline RBLT. Dummy SRAM cells 201 optionally are added in parallel with the SRAM cell 201 shown in FIG. 2, to match the bitline capacitance of the dual-mode 8T SRAM PSRO 300 as illustrated in FIG. 3, to the bitline capacitance of functional SRAM circuits.

Referring now to FIG. 3, there is shown an 8T SRAM dual-mode performance screen ring oscillator (PSRO) generally designated by the reference character 300 in accordance with the preferred embodiment.

The 8T SRAM PSRO 300 includes a chain 302 of a plurality of SRAM base blocks 200, #1-N connected together in a chain as illustrated. The reset signal RESET_B is brought into all SRAM base blocks 200, #1-N in parallel. The read input signal R_WB is brought into all SRAM base blocks 200, #1-N in parallel. The output WLOUT of SRAM base blocks 200 #1-(N−1) is connected to the input WLIN in the next SRAM base block 200 #2-N. The output WLOUT of SRAM base block 200 #N is coupled to the input WLIN in the SRAM base block 200 #1 through the illustrated logic gates.

The 8T SRAM PSRO 300 provides a ring oscillator output signal RINGOUT. As shown, the wordline input WLIN is applied to the first SRAM base block 200, #1 and the output WLOUT of the SRAM base block 200, #N provides a feedback signal applied to an inverter 304 providing an inverted feedback signal applied to a NAND gate 306. The inverted feedback signal is combined with a control signal GO by NAND gate 306. The NAND gate 306 is used to stop and start the ring operation. The GO signal of the feedback two input NAND gate 306 stops the ring operation when low and allows the ring to run when high. The output of NAND gate 306 is applied to an inverter 308 providing an inverted controlled feedback signal applied to a NAND gate 310 and coupled to the input WLIN in the SRAM base block 200 #1. Since the operation is a series write and read but parallel reset the output RINGOUT of the 8T SRAM PSRO 300 is a short pulse. A plurality of inverters 312, 314, 316, 318 optionally is included in a ring output path to a second input to NAND gate 310 to expand the pulse width of the ring oscillator output signal RINGOUT for sending across an associated chip. A final pair of inverters 320, 322 optionally is connected to the output of NAND gate 310, which provide the ring oscillator output signal RINGOUT.

The reset signal RESET_B is applied in parallel to each of the plurality of the SRAM base blocks 200 so that the period of the ring oscillator output signal RINGOUT is a function of many series write and read operations but only a single reset time.

The operation of the 8T SRAM base block 200 illustrated in FIG. 2 and used in 8T SRAM PSRO 300 may be understood as follows:

Read Performance Mode

1) The RESET_B signal will start high with WLIN low, applied to the gate of NAND gate 216. Input R_WB is a DC signal, and in read performance mode it is always high. In read performance mode, WBLT, WBLC, and WWL are also DC signals. The reset signal RESET_B is NORed with R_WB to make WBLT node of the SRAM cell 201 to go low and WBLC node of the SRAM cell 201 to go high. R_WB_B being low applied to NAND gate 227 makes WWL always high. This configuration forces node TRU of the SRAM cell 201 to be low and node CMP of the SRAM cell 201 to be high in read performance mode.

2) While RESET_B is still high, WLIN goes high causing output NET1 of NAND gate 216 to go low and output RWK of NAND gate 218 and output PCH of inverter 220 to go high. This causes a "0" to be read from the SRAM cell 201. The read bitline RBLT goes low and NAND 234 in the local evaluation circuit 230 causes output WLOUT to go high. FIG. 3 shows the entire circuit 8T SRAM PSRO 300 where many base blocks 200, #1-N are connected together, where WLOUT is connected to WLIN of the next base block and this operation now repeats.

3) The RESET_B signal is significant after this reading of the 8T SRAM cell has propagated through all of the base blocks 200. The feedback is inverted to reset all the 8T SRAM cells in parallel. During this reset, RESET_B goes low causing NET1 to go high and RWL and PCH to go low. This causes PFET 232 to pull read bitline RBLT high and WLOUT to go low. The waveforms are shown in FIGS. 4, 5, 6A, 6B, and 7.

Write-Through Performance Mode

1) The RESET_B signal will start high with WLIN low, applied to the gate of NAND gate 216. Input R_WB applied to NOR gate 222 and NAND gate 218 is a DC signal, and in write-through performance mode Input R_WB is always low, which the output R_WB_B of inverter 226 always high. In write performance mode, output RWL of NAND gate 218 is also a DC signal and output RWL is always high. The reset signal RESET_B is NORed with R_WB to make WBLT node of the SRAM cell 201 low and WBLC node of the SRAM cell 201 high. Input WLIN is low so output NET1 of NAND gate 216 is high. All "1's" at the input of NAND gate 228 make gate input WWL of NFETs 206, 208 low.

2) While input RESET_B is still high, input WLIN goes high causing output NET1 of NAND gate 216 to go low and PCH to go high. The output NET1 of NAND gate 216 going low causes output WWL of NAND gate 228 to go high. This causes a zero to be written to the SRAM cell 201 from node WBLT to node TRU. Then, node CMP goes high and the read bitline RBLT goes low and in the local evaluation circuit 230, the NAND gate 234 provides output WLOUT high. Again refer to FIG. 3, the entire circuit 8T SRAM PSRO 300 is shown with many base blocks 200, #1-N connected together. Output WLOUT of NAND gate 234 is connected to WLIN in the next base block where this operation now repeats.

3) The signal RESET_B is significant after this write-through of the 8T SRAM cell 201 has propagated through all of the base blocks 200, #1-N. The feedback is inverted to reset all the 8T SRAM cells in parallel. During this reset, the signal RESET_B goes low causing SRAM cell node WBLT to go high, SRAM cell node WBLC to go low, and SRAM cell node WWL to go high. This writes the opposite state back to the SRAM cell 201. Also, output NET1 of NAND gate 216 goes high causing node PCH to go low and PFET 232 pulls read bitline RBLT high and NAND gate 234 in the local evaluation circuit 230 causes WLOUT to go low. The waveforms are shown in FIGS. 4, 5, 6A, 6B, and 7.

Referring also to FIGS. 4, 5, 6A, 6B, and 7, there are shown waveforms illustrating the operation of the dual mode SRAM performance screen ring oscillator (PSRO) 300 in accordance with the preferred embodiment.

Figure 4:
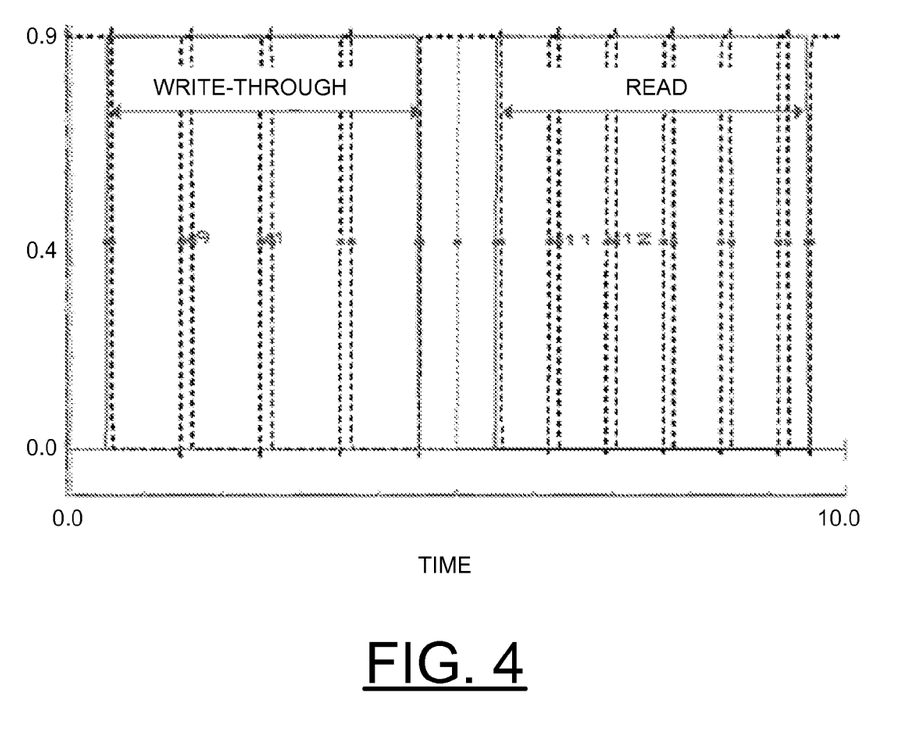
FIGS. 4, 5, 6A, 6B, and 7 are charts illustrating operation of the exemplary dual-mode SRAM performance screen ring oscillator (PSRO) of FIG. 3 in accordance with the preferred embodiment.

FIG. 4 shows the simulated top level waveforms of the dual mode SRAM PSRO 300. When the GO control signal goes high enabling the ring operation, the ring oscillator output signal RINGOUT produces a series of repeated pulses where the period is determined by the series write-through operations or read operations and single reset operation per pulse. Note that the period of the RINGOUT pulse is larger for the write-through operations than the read operations.

Figure 5:
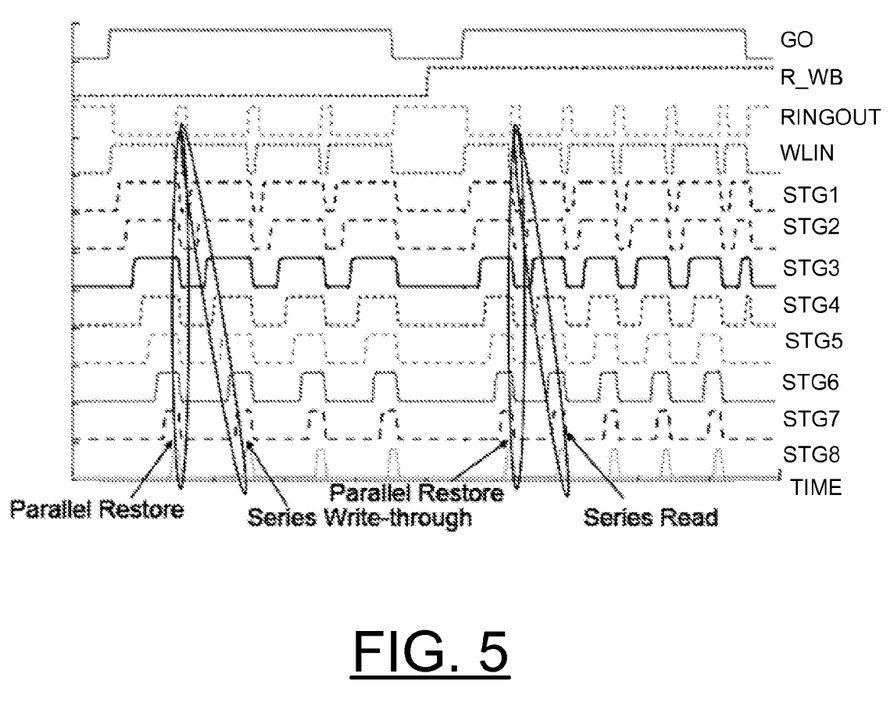

FIG. 5 shows the simulated waveforms of the top level nets between the base SRAM building blocks 200 of the dual mode SRAM PSRO 300. Eight base SRAM blocks 200 were used in the embodiment of the circuit simulated to generate the waveforms of FIG. 5. FIG. 5 illustrates exemplary illustrated waveforms WLOUT coupled between the base building blocks 200 and labeled STG1-STG8 with an input waveform WLIN applied to the first block 200, #1. FIG. 5 shows how the reset is done in parallel with each RINGOUT pulse and labeled Parallel Restore and the following series nature of the write-through operations and read operations labeled Series Write-through and Series Read.

Figure 6A:
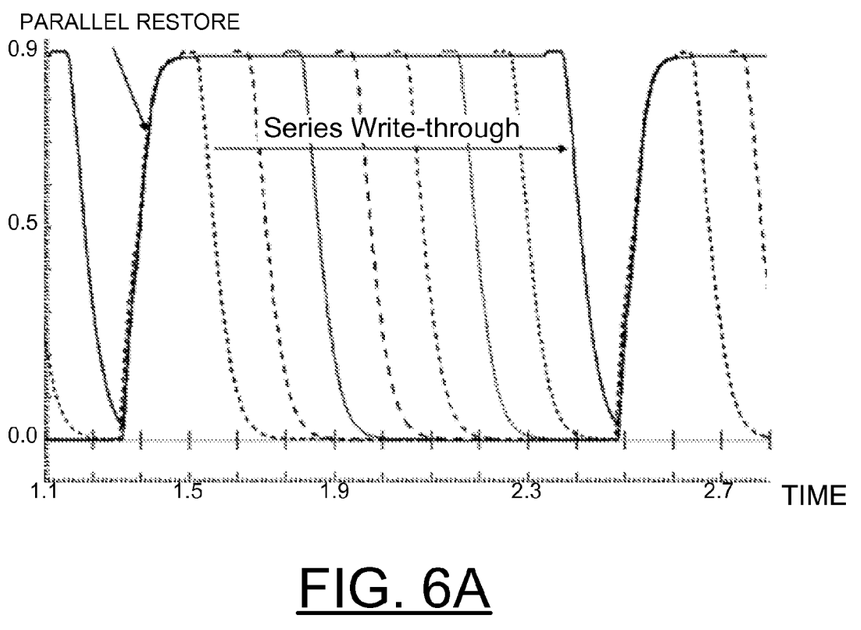

FIG. 6A shows the simulated waveforms of the internal read bitlines (RBLT) inside the base SRAM building blocks 200 of the dual mode SRAM PSRO 300 for the write through performance mode. FIG. 6A illustrates the parallel reset of the entire dual mode SRAM PSRO 300 labeled Parallel Restore and the series nature of the write-through operations labeled Series Write-through.

Figure 6B:
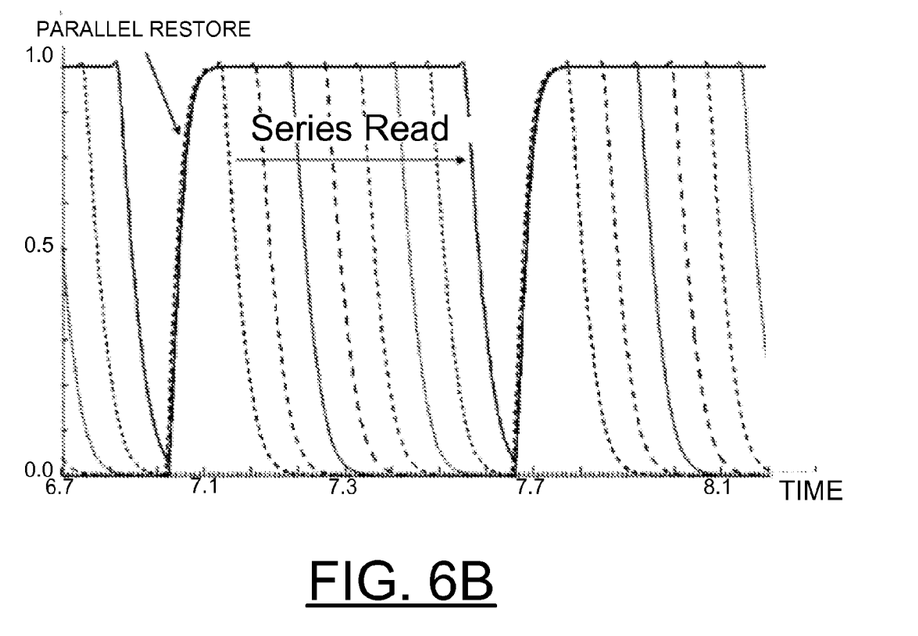

FIG. 6B shows the simulated waveforms of the internal read bitlines (RBLT) inside the base SRAM building blocks 200 of the dual mode SRAM PSRO 300 for the read performance mode. FIG. 6B illustrates the parallel reset of the entire dual mode SRAM PSRO 300 labeled Parallel Restore and the series nature of the read operations labeled Series Read.

Figure 7:
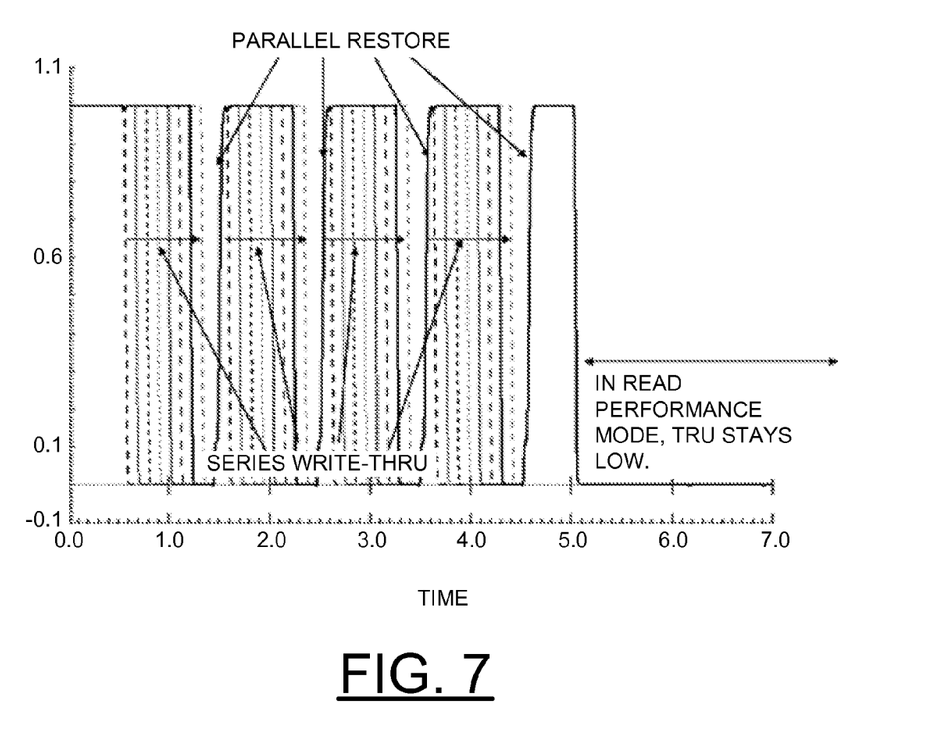

FIG. 7 shows the simulated waveforms of the internal true node TRU of the 8T SRAM cells 201 inside the base SRAM building blocks 200 of the dual mode SRAM PSRO 300. FIG. 7 illustrates the parallel reset of the entire dual mode SRAM PSRO 300 labeled PARALLEL RESTORE and the series nature of the write-through and read operations labeled SERIES WRITE-THRU. In the read performance mode, node TRU stays low.

Figure 8:
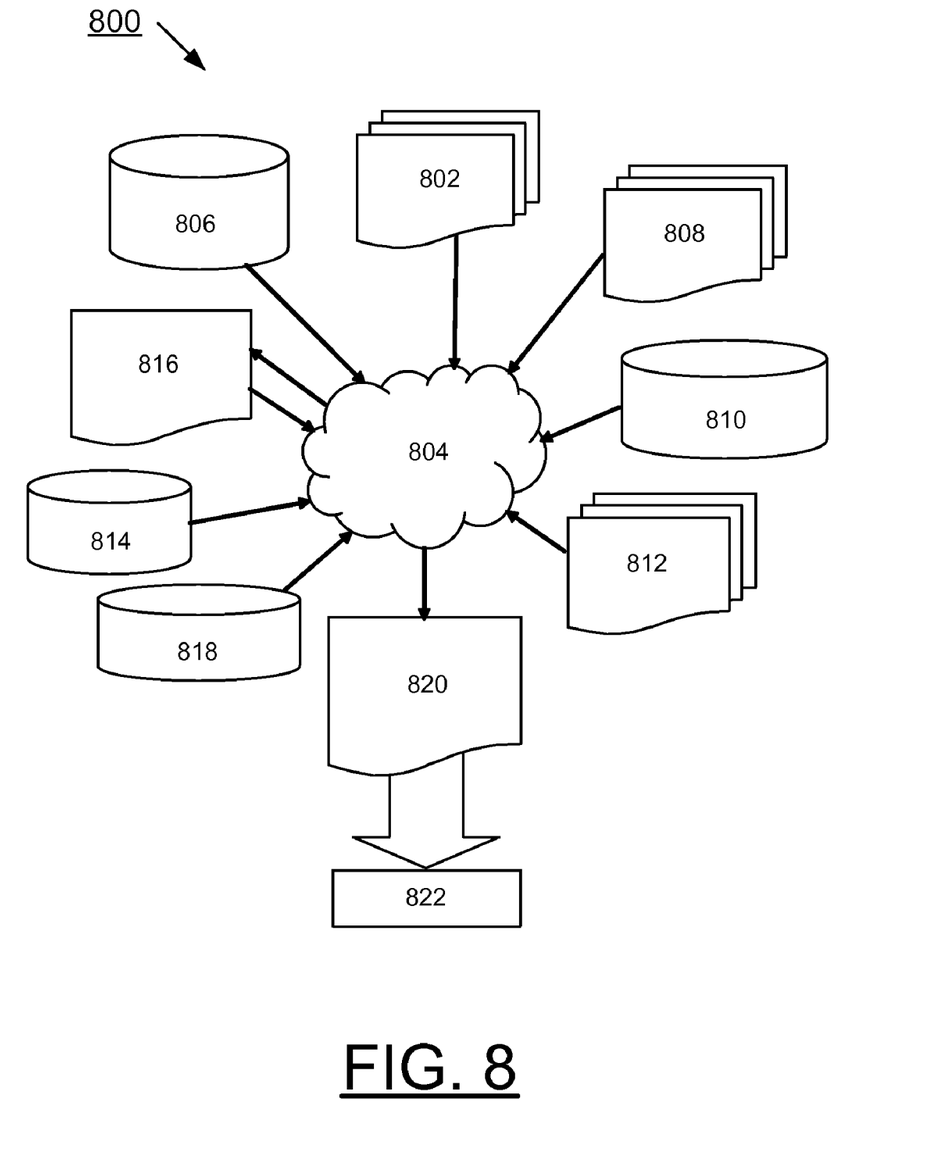
FIG. 8 is a flow diagram of a design process used in semiconductor design, manufacturing, and/or test.

FIG. 8 shows a block diagram of an example design flow 800. Design flow 800 may vary depending on the type of IC being designed. For example, a design flow 800 for building an application specific IC (ASIC) may differ from a design flow 800 for designing a standard component. Design structure 802 is preferably an input to a design process 804 and may come from an IP provider, a core developer, or other design company or may be generated by the operator of the design flow, or from other sources. Design structure 802 comprises circuits 100, 200, 300 in the form of schematics or HDL, a hardware-description language, for example, Verilog, VHDL, C, and the like. Design structure 802 may be contained on one or more machine readable medium. For example, design structure 802 may be a text file or a graphical representation of circuits 100, 200, 300. Design process 804 preferably synthesizes, or translates, circuits 100, 200, 300 into a netlist 806, where netlist 806 is, for example, a list of wires, transistors, logic gates, control circuits, I/O, models, etc. that describes the connections to other elements and circuits in an integrated circuit design and recorded on at least one of machine readable medium. This may be an iterative process in which netlist 806 is resynthesized one or more times depending on design specifications and parameters for the circuits.

Design process 804 may include using a variety of inputs; for example, inputs from library elements 808 which may house a set of commonly used elements, circuits, and devices, including models, layouts, and symbolic representations, for a given manufacturing technology, such as different technology nodes, 32 nm, 45 nm, 90 nm, and the like, design specifications 810, characterization data 812, verification data 814, design rules 816, and test data files 818, which may include test patterns and other testing information. Design process 804 may further include, for example, standard circuit design processes such as timing analysis, verification, design rule checking, place and route operations, and the like. One of ordinary skill in the art of integrated circuit design can appreciate the extent of possible electronic design automation tools and applications used in design process 804 without deviating from the scope and spirit of the invention. The design structure of the invention is not limited to any specific design flow.

Design process 804 preferably translates an embodiment of the invention as shown in FIGS. 1, 2, and 3 along with any additional integrated circuit design or data (if applicable), into a second design structure 820. Design structure 820 resides on a storage medium in a data format used for the exchange of layout data of integrated circuits, for example, information stored in a GDSII (GDS2), GL1, OASIS, or any other suitable format for storing such design structures. Design structure 820 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, and 3. Design structure 820 may then proceed to a stage 822 where, for example, design structure 820 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing an enhanced dual-mode static random access memory (SRAM) performance screen ring oscillator (PSRO) comprising:
    a plurality of SRAM base blocks connected together in a chain;
    each of said plurality of SRAM base blocks including an eight-transistor (8T) SRAM cell; said 8T SRAM cell being an unmodified 8T SRAM cell; a logic function coupled to said SRAM cell and to a local evaluation circuit coupled to said SRAM cell;
    said logic function of each of said plurality of SRAM base blocks receiving a read control signal input, a wordline input and a reset signal input; and said local evaluation circuit of each of said plurality of SRAM base blocks providing a wordline output;
    said reset signal and said read control signal input being applied in parallel to each of said plurality of SRAM base blocks;
    said wordline output of said SRAM base blocks being applied to said wordline input of a next one of said SRAM base blocks in said chain, and said wordline output of a last one of said plurality of SRAM base blocks in said chain providing a feedback signal coupled to said wordline input of a first one of said plurality of SRAM base blocks; and
    the dual-mode SRAM PSRO includes a write-through mode of operation responsive to said read control signal input, with an output frequency being determined by write-through performance of the 8T SRAM cell; and a read performance mode of operation responsive to said read control signal input, with the output frequency being determined by read performance of the 8T SRAM cell.

2. The circuit as recited in claim 1 wherein said unmodified 8T SRAM cell includes a static latch defined by a pair of parallel reverse polarity connected inverters, a pair of access N-channel field effect transistors (NFETs) respectively connected between a first side and a second side of said static latch and a respective write bitline input, a wordline input applied to a respective gate input of said access NFETs, and a pair of series connected N-channel field effect transistors (NFETs) connected to a read bitline RBLT and having a respective gate input connected to a read wordline and said second side of said static latch.

3. The circuit as recited in claim 1 wherein said logic function of each of said plurality of SRAM base blocks includes a NOR gate receiving said read control signal input and said reset signal input, said NOR gate providing a first write bit line input applied to said 8T SRAM cell.

4. The circuit as recited in claim 3 further includes an inverter receiving said first write bit line output of said NOR gate and said inverter providing a second write bit line input applied to said 8T SRAM cell.

5. The circuit as recited in claim 3 wherein said logic function of each of said plurality of SRAM base blocks include a first NAND gate receiving said wordline input and said reset signal.

6. The circuit as recited in claim 5 further includes a second NAND gate receiving said read control signal input and an output of said first NAND gate, and applying a read wordline input to said 8T SRAM cell.

7. The circuit as recited in claim 5 further includes an inverter receiving an output of said first NAND gate and said inverter providing a precharge input to said local evaluation circuit.

8. The circuit as recited in claim 5 further includes a three-input NAND gate receiving an output of said first NAND gate, said reset signal and said read control signal, said three-input NAND gate providing a write wordline gate input to said 8T SRAM cell.

9. A method for implementing an enhanced dual-mode static random access memory (SRAM) performance screen ring oscillator (PSRO) comprising the steps of:
    providing a plurality of SRAM base blocks connected together in a chain;
    implementing each of said plurality of SRAM base blocks with an eight-transistor (8T) SRAM cell; said 8T SRAM cell being an unmodified 8T SRAM cell; a logic function coupled to said SRAM cell and to a local evaluation circuit coupled to said SRAM cell;
    applying a read control signal input, a wordline input and a reset signal input to said logic function of each of said plurality of SRAM base blocks; and providing a wordline output with said local evaluation circuit of each of said plurality of SRAM base blocks;
    applying said reset signal and said read control signal input in parallel to each of said plurality of SRAM base blocks;

applying said wordline output of said SRAM base blocks to said wordline input of a next one of said SRAM base blocks in said chain, and providing a feedback signal with said wordline output of a last one of said plurality of SRAM base blocks in said chain to said wordline input of a first one of said plurality of SRAM base blocks;

operating the dual-mode SRAM PSRO in a write-through mode responsive to said read control signal input, with an output frequency being determined by write-through performance of the 8T SRAM cell; and operating the dual-mode SRAM PSRO in a read performance mode responsive to said read control signal input, with the output frequency being determined by read performance of the 8T SRAM cell.

10. The method as recited in claim 9 wherein implementing each of said plurality of SRAM base blocks with said unmodified eight-transistor (8T) SRAM cell includes implementing said 8T SRAM cell with a static latch defined by a pair of parallel reverse polarity connected inverters, a pair of access N-channel field effect transistors (NFETs) respectively connected between a first side and a second side of said static latch and a respective write bitline input, a wordline input applied to a respective gate input of said access NFETs, and a pair of series connected N-channel field effect transistors (NFETs) connected to a read bitline RBLT and having a respective gate input connected to a read wordline and said second side of said static latch.

11. The method as recited in claim 9 wherein implementing each of said plurality of SRAM base blocks with said logic function includes providing a NOR gate receiving said read control signal input and said reset signal input, said NOR gate providing a first write bit line input applied to said 8T SRAM cell and an inverted output of said NOR gate providing a second write bit line input applied to said 8T SRAM cell.

12. The method as recited in claim 11 wherein implementing each of said plurality of SRAM base blocks with said logic function includes providing a first NAND gate receiving said wordline input and said reset signal.

13. The method as recited in claim 12 wherein implementing each of said plurality of SRAM base blocks with said logic function includes providing a three-input NAND gate receiving an output of said first NAND gate, said reset signal and said read control signal, said three-input NAND gate providing a write wordline gate input to said 8T SRAM cell.

14. The method as recited in claim 12 wherein implementing each of said plurality of SRAM base blocks with said logic function includes providing an inverter receiving an output of said first NAND gate and said inverter providing a precharge input to said local evaluation circuit.

15. A design structure embodied in a machine readable medium used in a design process, the design structure comprising:

a dual-mode static random access memory (SRAM) performance screen ring oscillator (PSRO) circuit tangibly embodied in the machine readable medium used in the design process, said dual-mode SRAM PSRO circuit including a plurality of SRAM base blocks connected together in a chain;

each of said plurality of SRAM base blocks including an eight-transistor (8T) SRAM cell; said 8T SRAM cell being an unmodified 8T SRAM cell; a logic function coupled to said SRAM cell and to a local evaluation circuit coupled to said SRAM cell;

said logic function of each of said plurality of SRAM base blocks receiving a read control signal input, a wordline input and a reset signal input; and said local evaluation circuit of each of said plurality of SRAM base blocks providing a wordline output;

said reset signal and said read control signal input being applied in parallel to each of said plurality of SRAM base blocks;

said wordline output of said SRAM base blocks being applied to said wordline input of a next one of said SRAM base blocks in said chain, and said wordline output of a last one of said SRAM base blocks in said chain providing a feedback signal coupled to said wordline input of a first one of said plurality of SRAM base blocks; and the dual-mode SRAM PSRO includes a write-through mode of operation responsive to said read control signal input, with an output frequency being determined by write-through performance of the 8T SRAM cell; and a read performance mode of operation responsive to said read control signal input, with the output frequency being determined by read performance of the 8T SRAM cell, wherein the design structure, when read and used in the manufacture of a semiconductor chip produces a chip comprising said dual-mode SRAM PSRO circuit.

16. The design structure of claim 15, wherein the design structure comprises a netlist, which describes said dual-mode SRAM PSRO circuit.

17. The design structure of claim 15, wherein the design structure resides on storage medium as a data format used for the exchange of layout data of integrated circuits.

18. The design structure of claim 15, wherein the design structure includes at least one of test data files, characterization data, verification data, or design specifications.

19. The design structure of claim 15, wherein said unmodified 8T SRAM cell includes a static latch defined by a pair of parallel reverse polarity connected inverters, a pair of access N-channel field effect transistors (NFETs) respectively connected between a first side and a second side of said static latch and a respective write bitline input, a wordline input applied to a respective gate input of said access NFETs, and a pair of series connected N-channel field effect transistors (NFETs) connected to a read bitline RBLT and having a respective gate input connected to a read wordline and said second side of said static latch.

20. The design structure of claim 15, wherein said logic function of each of said plurality of SRAM base blocks includes a NOR gate receiving said read control signal input and said reset signal input, said NOR gate providing a first write bit line input applied to said 8T SRAM cell, and an inverter providing an inverted NOR gate output providing a second write bit line input applied to said 8T SRAM cell.

* * * * *